US007898810B2

(12) United States Patent
Mason et al.

(10) Patent No.: US 7,898,810 B2
(45) Date of Patent: Mar. 1, 2011

(54) AIR COOLING FOR A PHASED ARRAY RADAR

(75) Inventors: James S. Mason, Richardson, TX (US); Ronald J. Richardson, McKinney, TX (US); James S. Wilson, Hurst, TX (US); Erika Ramirez, Plano, TX (US)

(73) Assignee: Raytheon Company, Waltham, MA (US)

( * ) Notice: Subject to any disclaimer, the term of this patent is extended or adjusted under 35 U.S.C. 154(b) by 166 days.

(21) Appl. No.: 12/340,171

(22) Filed: Dec. 19, 2008

(65) Prior Publication Data

US 2010/0157531 A1 Jun. 24, 2010

(51) Int. Cl.
*H05K 7/20* (2006.01)
(52) U.S. Cl. ............ 361/717; 361/688; 361/692; 361/697; 361/707; 361/709; 165/80.4; 165/104.33; 343/771; 343/872; 343/878
(58) Field of Classification Search ............ 361/679.48, 361/688, 689, 690, 695, 607, 699, 700, 692, 361/694, 697, 701, 702, 704, 707, 709, 717
See application file for complete search history.

(56) References Cited

U.S. PATENT DOCUMENTS

| 4,581,614 | A | 4/1986 | LaCourse | 343/368 |
| 5,408,207 | A | 4/1995 | Chanteau | |
| 5,854,607 | A * | 12/1998 | Kinghorn | 343/853 |
| 6,305,463 | B1 * | 10/2001 | Salmonson | 165/80.3 |
| 6,442,023 | B2 * | 8/2002 | Cettour-Rose et al. | 361/690 |
| 6,536,516 | B2 * | 3/2003 | Davies et al. | 165/170 |
| 7,129,908 | B2 | 10/2006 | Edward et al. | 343/878 |
| 7,363,701 | B1 * | 4/2008 | Ehret et al. | 29/610.1 |
| 7,508,338 | B2 * | 3/2009 | Pluymers et al. | 342/175 |
| 2005/0270250 | A1 * | 12/2005 | Edward et al. | 343/878 |
| 2006/0026983 | A1 * | 2/2006 | Tilton et al. | 62/310 |

FOREIGN PATENT DOCUMENTS

EP  1 753 073 A2  2/2007
EP  1 885 169 A1  2/2008

OTHER PUBLICATIONS

PCT Notification of Transmittal of the International Search Report and the Written Opinion of the International Searching Authority, or the Declaration mailed Apr. 2, 2010 with regard to PCT/US2009/065266 filed Nov. 20, 2009.

* cited by examiner

*Primary Examiner*—Boris L. Chervinsky
*Assistant Examiner*—Courtney Smith
(74) *Attorney, Agent, or Firm*—Baker Botts L.L.P.

(57) ABSTRACT

In certain embodiments, a structure for electronic components includes a baseplate having a substantially planar shape. The baseplate defines one or more openings allowing air flow. The structure includes a frame coupled to the baseplate. The frame includes a planar support with a substantially planar shape that is substantially parallel to the baseplate. Then planar support and baseplate at least partially defines one or more plenums. The planar support is also configured to support one or more transmit/receive integrated microwave modules. The frame also includes a plurality of frame supports that define one or more channels for air flow. Each channel corresponds to one of the plenums. Additionally, the frame includes a ventilated panel with a surface defining a plurality of air inlets. The air inlets allow air into one of the one or more plenums. Also, the frame includes one or more thermal interfaces configured to dissipate heat.

19 Claims, 9 Drawing Sheets

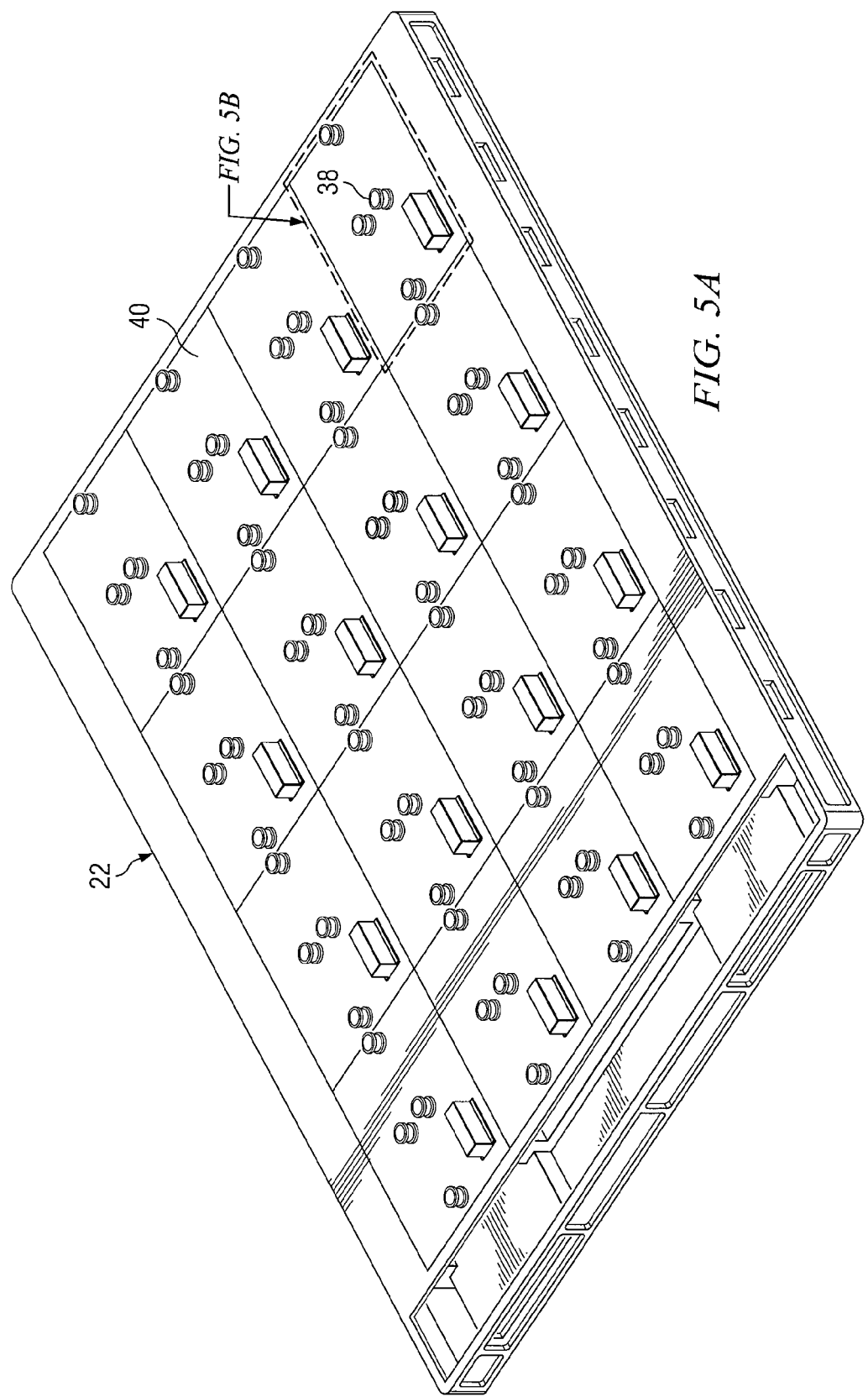

AIR COOLING FOR A PHASED ARRAY RADAR

TECHNICAL FIELD

The present invention relates generally to communications and, more particularly, to a structure for communications hardware.

BACKGROUND

Electronic scanned array (ESA) sensors may be used in a variety of applications. For example, ESA sensors may be used to detect the location of objects. To detect the location of objects, ESA sensors may utilize a plurality of elements that radiate signals with different phases that produce constructive or destructive interference. The phases may be changed to steer the beam to point in a certain direction. ESA sensors may both transmit and receive signals in a particular direction to detect the presence of an object.

When ESA sensors are used in combat settings, difficulties can arise. For example, ESA sensors may generate a high level of waste heat, and may be large, expensive, prone to damage, or difficult to repair.

SUMMARY OF THE DISCLOSURE

In certain embodiments, a structure for electronic components includes a baseplate having a substantially planar shape. The baseplate defines one or more openings that allow air flow. The structure also includes a frame coupled to the baseplate. The frame includes a planar support with a substantially planar shape. The planar support is substantially parallel to the baseplate. Then planar support and baseplate at least partially defines one or more plenums. The planar support is also configured to support one or more transmit/receive integrated microwave modules. The frame also includes a plurality of frame supports that define one or more channels for air flow. Each channel corresponds to one of the plenums. Additionally, the frame includes a ventilated panel with a surface defining a plurality of air inlets. The air inlets allow air into one of the one or more plenums. Also, the frame includes one or more thermal interfaces configured to dissipate heat.

Certain embodiments may provide numerous technical advantages. For example, technical advantages of certain embodiments may include an integrated structure for a phased array radar that includes thermal interfaces and electrical interfaces located in the same spatial plane, thereby reducing depth. Certain embodiments include integrated, multi-purpose structural elements that facilitate air-cooling of electronics components, thermal management, and structural stiffness and integrity. Additional technical advantages of certain embodiments include a modular design comprising one or more apertures (i.e., cells or sub-units) that provide component redundancy and modular functionality for improved system reliability, adaptability, and maintainability. As a result, embodiments may provide a lightweight, simple, inexpensive, and compact solution for an array that combines thermal management, air management functionality, and structural integrity.

Although specific advantages have been discussed above, various embodiments may include all, some, or none of the mentioned advantages. Additionally, other technical advantages may become readily apparent to one of ordinary skill in the art after review of the following figures and description.

BRIEF DESCRIPTION OF THE DRAWINGS

For a more complete understanding of example embodiments of the present invention and its advantages, reference is now made to the following description, taken in conjunction with the accompanying drawings, in which:

FIGS. 5A and 5B illustrate a baseplate and subplate of an AESA structure, according to certain embodiments;

DETAILED DESCRIPTION

Embodiments of the disclosure and its advantages are best understood by referring to FIGS. 1 through 7 of the drawings, like numerals being used for like and corresponding parts of the various drawings.

It should be understood at the outset that although example embodiments of the disclosure are illustrated below, it may be implemented using any number of techniques, whether currently known or not yet in existence. The disclosure should not be limited to the example embodiments, drawings, and techniques illustrated below, including the embodiments and implementation illustrated and described herein. Additionally, the drawings are not drawn to scale.

In combat settings, active electronic scanned array (AESA) sensors may be used to detect the presence of objects. However, difficulties can arise in such settings. For example, AESA sensors may become damaged and need repair, and may be expensive to purchase and maintain. In addition, AESA sensors may be large and heavy, making them difficult to maneuver and transport in battlefield settings. Moreover, AESA sensors may generate excess waste heat and require cooling systems to operate properly.

Figure 1:
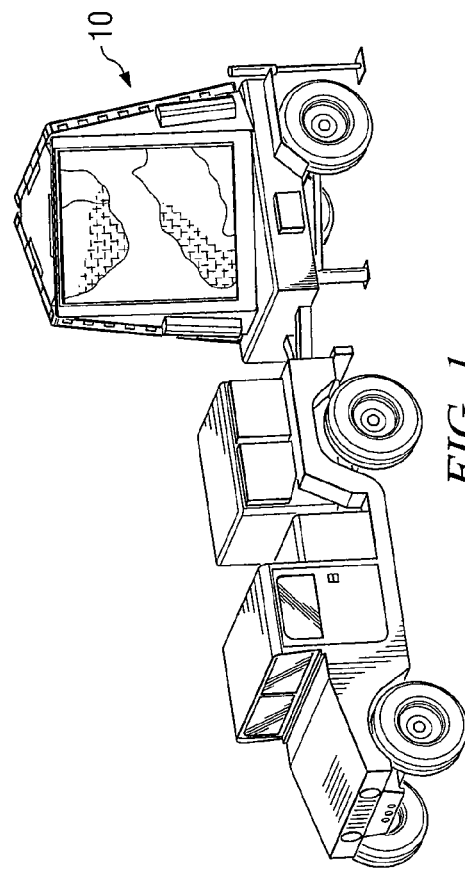
FIG. 1 illustrates an environmental view of an active electronically scanned array (AESA) unit disposed in a battlefield setting according to certain embodiments.

FIG. 1 shows an environmental view of AESA structures 10 mounted on an armored transport, according to certain embodiments. AESA structure 10 may be utilized in radar systems that feature short to instantaneous (millisecond) scanning rates and have a low probability of intercept, and are often utilized in military applications. Radar systems operating with AESA structure 10 may transmit or receive in the Ka frequency band, which is approximately 27-40 GHz. In other embodiments, transmission and reception may occur in other frequency bands, for example, lower than 27 GHz or higher than 40 GHz. Such systems are often utilized in military and defense operations. Accordingly, AESA structure 10 may be constructed to protect the electronic components within it and may also be mobile, efficient, and simple to repair and maintain.

In FIG. 1, AESA structure 10 is constructed as a panel. As shown in FIG. 1, multiple AESA units 10 may be arranged and configured to operate together. In certain embodiments, AESA structure 10 may include elements for air-cooling electronic components, reducing or eliminating the need for liquid cooling systems. Additionally, AESA structure 10 may include particular elements or components, such as thermal interfaces and electronics interfaces, that may be integrated and/or located in the same planar space, thereby reducing depth. AESA structure 10 may include one or more modular apertures (i.e., cells or sub-units) with independent structural, electronic, and/or thermal management components. AESA structure 10 may also include waveguides (or other radio-frequency transmission medium, such as coaxial cable) located in plenums within the AESA structure 10, and certain embodiments include a partitioned, removable baseplate. Such aspects of AESA structure 10, as well as additional aspects and features of the structure, are described in more detail below with reference to additional figures.

Figure 2B:
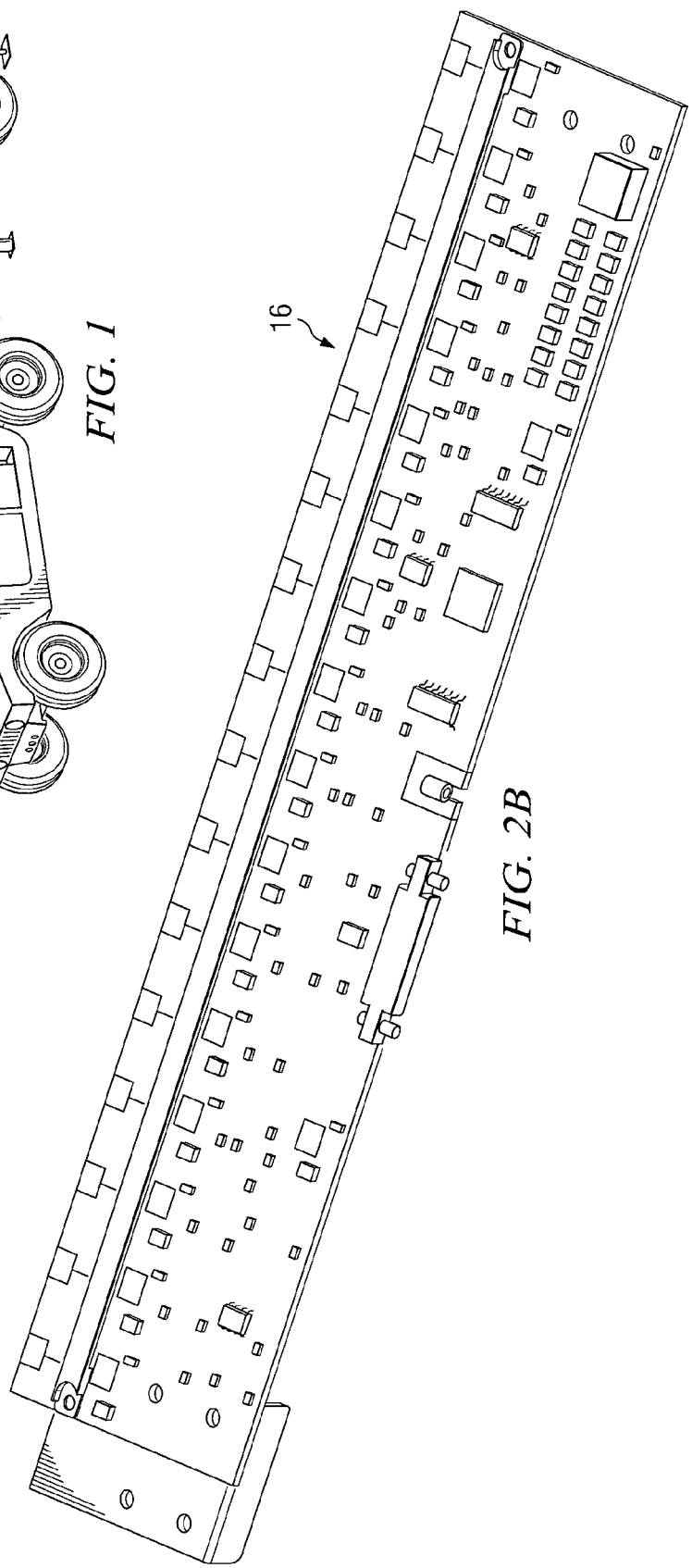
FIG. 2B illustrates an example TRIMM included in an AESA structure, according to certain embodiments.
Figure 2A:
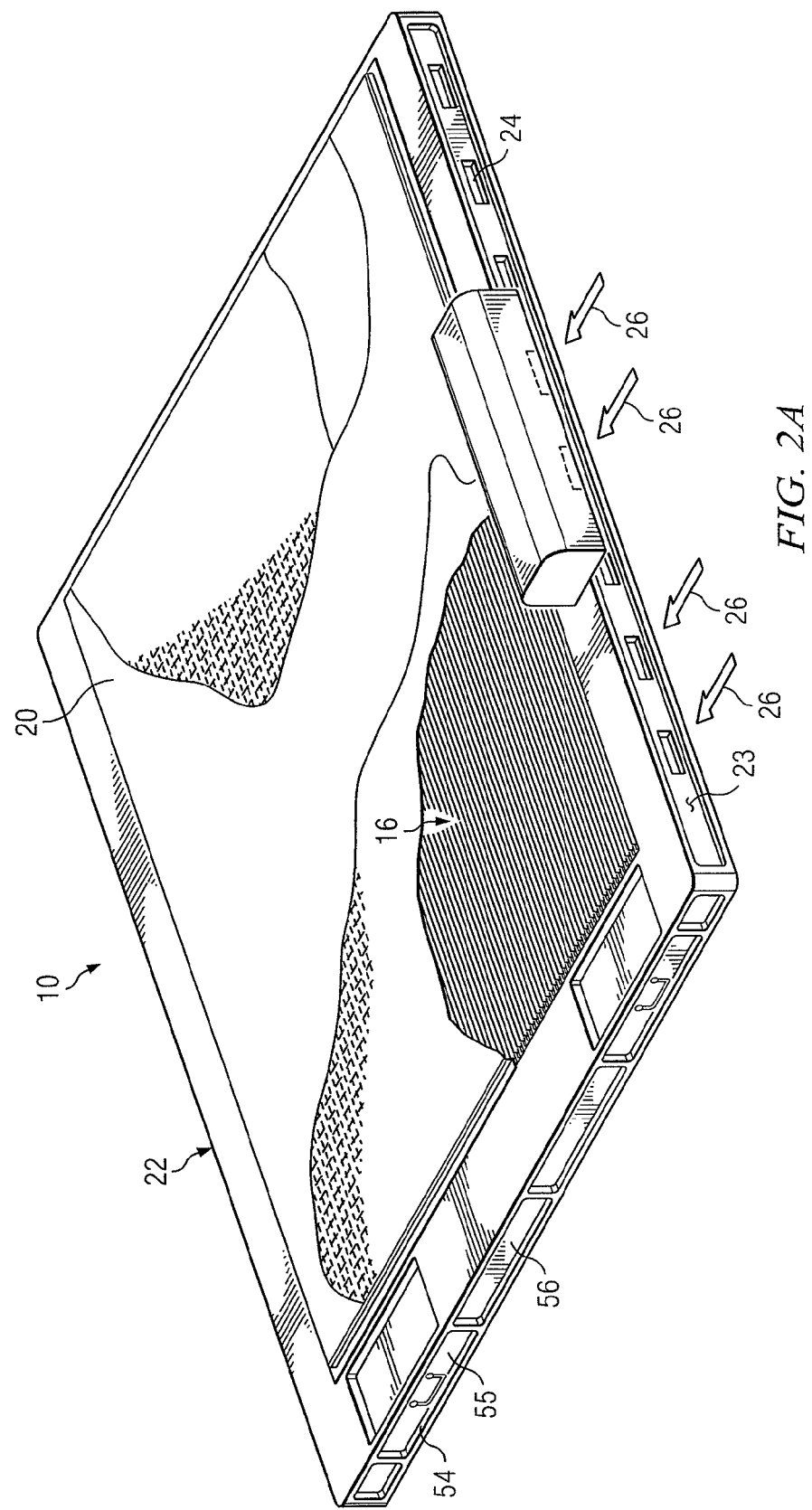
FIG. 2A illustrates a single an AESA structure, according to certain embodiments.

FIG. 2A shows a partial inside view of one AESA structure 10 of FIG. 1. AESA structure 10 includes a radome 20, frame 22, air inlets 24, transmit receive integrated microwave modules (TRIMMs) 16, desiccant cavity 54, and electronics cavity 56, coupled as shown.

In certain embodiments, frame 22 provides housing for one or more TRIMMs (or other transmit/receive modules) 16 (shown external to frame 22 for illustration purposes only), and additional components of AESA unit 10.

FIG. 2B illustrates an example TRIMM 16 according to certain embodiments. In some embodiments, TRIMMs 16 may boost output power of the transmitted signal up to its final radiated power, establish the system noise figure for receive, and/or perform other functions. TRIMM 16 may include power amplifier monolithic microwave integrated circuits (not illustrated), and may be low- or high-power modules. In certain embodiments, TRIMM 16 may be either a module-less TRIMM or a hermetic TRIMM. TRIMM 16 may be contained in a separate, environmentally sealed, desiccated volume within AESA structure 10 to control moisture and/or contamination from outside air.

In certain embodiments, TRIMM 16 may have any suitable components. For example, TRIMM 16 may be built off an RF, DC, MCB, or microwave circuit board. As another example, TRIMM 16 may include a thermal plane or interface. A thermal plane may be bonded to the backside of a TRIMM to conduct waste heat away from the modules. Alternatively, TRIMM 16 may be coupled with a thermal plane in other ways.

In some embodiments, AESA structure 10 may include more, fewer, or different components than those shown in the included figures. For example, AESA structure 10 may include electronic components in addition to or other than TRIMM 16, such as phase shifters for flared notched radiators.

Frame 22 may be made of aluminum, steel, composites such as carbon, plastic, or any other suitable material. Certain embodiments of frame 22 are constructed of aluminum 6061 alloy. In certain embodiments, frame 22 may be approximately 95-100 inches by 85-95 inches by 3-5 inches and may be configured to contain between 1000 and 1050 TRIMM assemblies 16. Frame 22 in such an embodiment may weigh between 300-400 pounds without heat sinks, or between 500-600 pounds with heat sinks, such as parallel plate heat sinks. In certain embodiments, the enclosed 1024 TRIMM assemblies may comprise 768 low-power TRIMM assemblies and 256 high-power TRIMM assemblies. In alternative embodiments, frame 22 may measure approximately 56 inches by 52 inches by 5 inches and configured to enclose 256 high-power TRIMM assemblies 16. In other embodiments, frame 22 may measure approximately 78 inches by 71 inches by 55 inches and configured to enclose 512 high-power TRIMM assemblies.

Although FIG. 2 indicates a particular size and shape of AESA structure 10, the illustration is included only as an example, and AESA structure 10 may be larger or smaller than the illustrated measurements in various embodiments. Similarly, although FIG. 2 may indicate a particular size and shape of frame 22, frame 22 may be any practicable size or shape. For example, in certain embodiments, the size and shape of frame 22 may vary depending on the components, configuration, and requirements of the system. Embodiments of AESA structure 10 may have one or more modular apertures (i.e., cells or sub-units). Various embodiments of AESA structure 10 may include such apertures arranged or configured in any suitable manner. Accordingly, apertures may provide a cell structure for various embodiments meeting different performance requirements, while maintaining the same basic sub-unit structure.

In certain embodiments, frame 22 may be manufactured using hog-out machining techniques or by other suitable techniques. For example, frame 22 may be hogged out of aluminum billet. In some embodiments, various elements described in the disclosure, such as planar supports, TRIMM supports, ventilated panels, thermal interfaces, heat sinks, removable baseplate/subplates, and/or frame supports, may be fabricated from the same aluminum billet. In certain embodiments, one or more of such components may be integrated, bonded or otherwise coupled to or integrated with frame 22. In such embodiments, bonding points may vary depending on the particular configuration and application for use.

Frame 22 may include a ventilated panel 23 along one or more sides of frame 22. Ventilated panel 23 has a surface defining one or more air inlets 24. Air inlets 24 may allow ambient air 26 to flow into the AESA structure 10 for cooling electronic components. Air inlets 24 may be of any practicable size or shape. In certain embodiments, air inlets 24 may be sized to allow a particular rate of air flow through frame 22 for removing waste heat. In certain embodiments, frame 22 also includes frame supports defining air channels (not shown). Such air channels may correspond (e.g., align) to air inlets 24 for channeling air flow through AESA structure 10. In certain embodiments, air inlets 24 may be covered in a material to reduce or prevent debris, moisture, and/or contamination from entering the AESA structure 10. Air inlets 24 may include a filter and/or other components for removing contaminants from air flowing into AESA structure 10.

In some embodiments, frame 22 (and/or other components) provides a sealed, desiccated volume for electronics components such as TRIMMs 16. Desiccant cavity 54 may receive a desiccant cartridge 55. In certain embodiments, desiccant cavity 54 may be accessible externally such that a desiccant cartridge 55 may be added, exchanged, or removed without disassembling the AESA structure 10. Electronics cavity 56 is configured to provide space for various electronic components, such as exciter electronics. In certain embodiments, electronics cavity 56 may include receiver exciter electronics or other electronic components related to operation of AESA structure 10.

A side of AESA structure 10 may include radome 20 coupled to frame 22. Radome 20 may allow electromagnetic radiation to propagate though a portion of AESA structure 10. Radome 20 may also designed to camouflage and/or protect the components within AESA structure 10 from damage. Radome 20, coupled with frame 22, may provide a sealed and/or regulated space for electronics components within AESA structure 10 (e.g., controlling humidity or preventing contamination).

Figure 3:
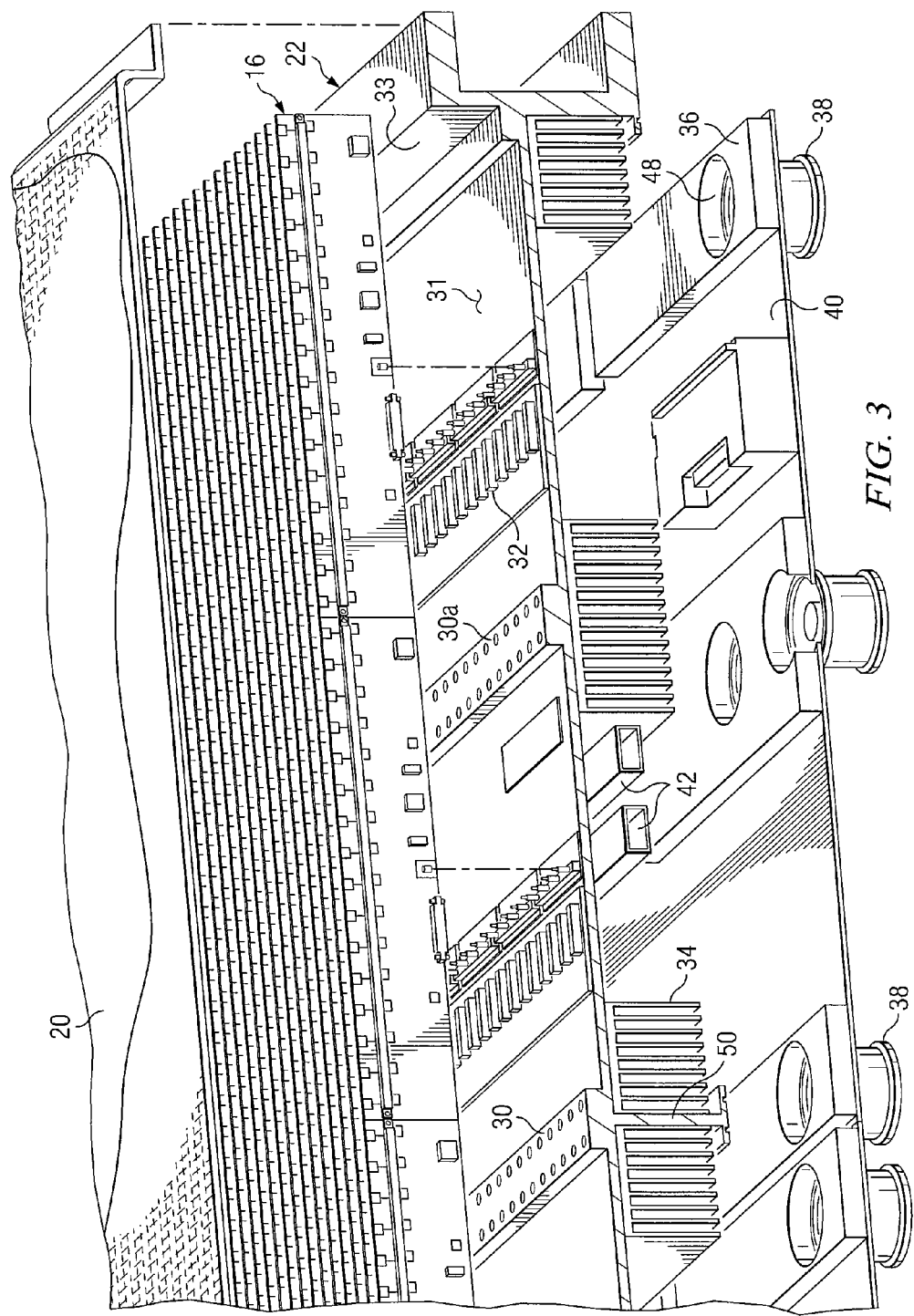
FIGS. 3 and 4 show internal views of an AESA structure, according to certain embodiments.
Figure 4:
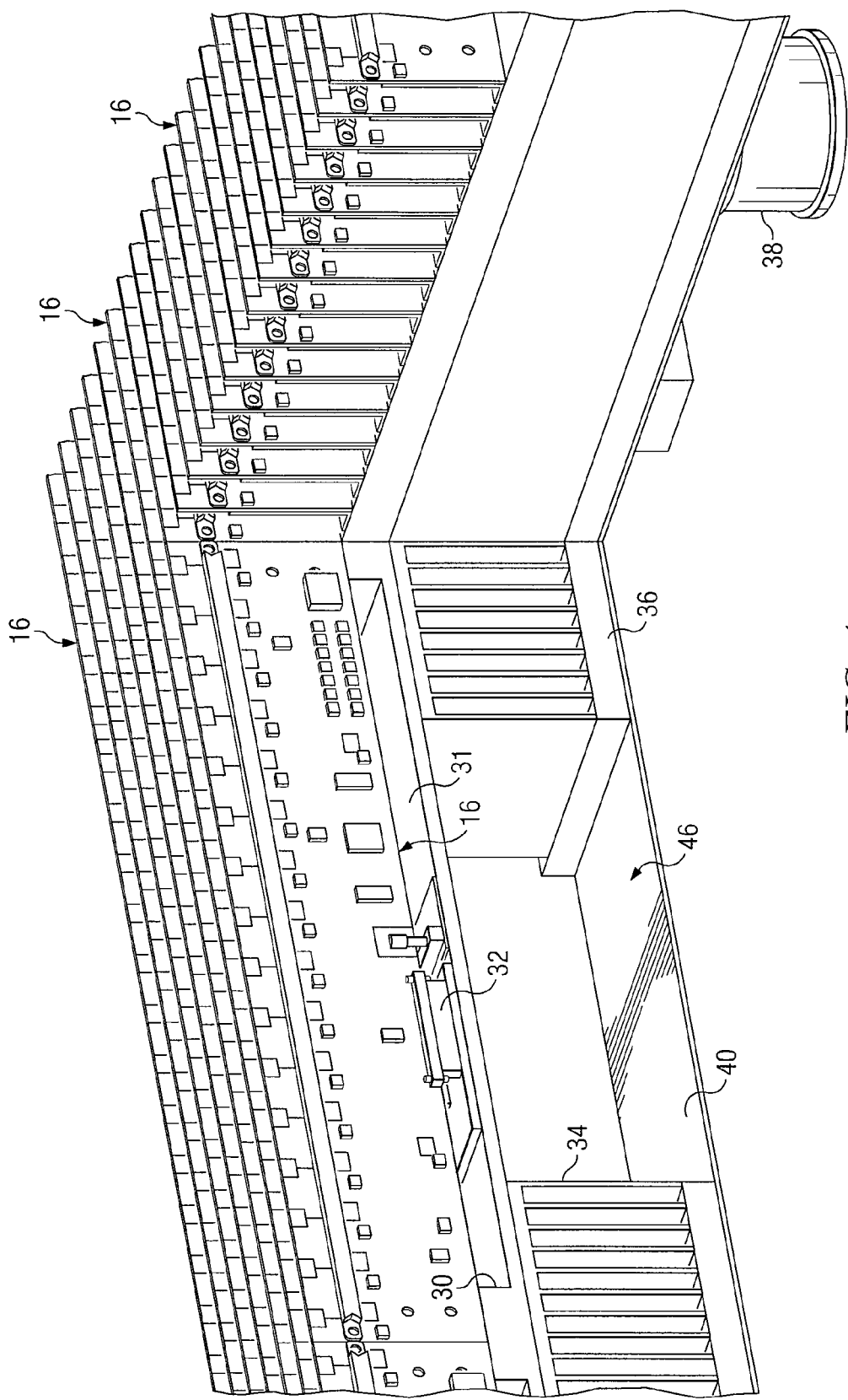

FIGS. 3 and 4 illustrate additional detail of an AESA structure 10 according to certain embodiments. AESA structure 10 includes TRIMMs 16, radome 20, frame 22, thermal interface 30, planar support 31, electronic interface 32, TRIMM support 33, heat sink material 34, plenum 46, baseplate 40, cooling fans 38, insulator 36, openings 48, and/or waveguides 42 coupled as shown.

Frame 22 may include a planar support 31, TRIMM support 33, thermal interface 30, thermal pedestal 30a, and/or frame support 50. Planar support 31 may comprise a substantially planar surface and may provide support and/or mounting surface for various components of AESA structure 10. Planar support 31 may partially define one or more plenums for air flow through AESA structure 10, and/or may separate electronic components on a first side of planar support 31 (e.g., TRIMMs 16, electronic interface 32, etc) from components on a second side of planar support 31, such as plenum 46, heat sink material 34, and/or air flow through AESA structure 10. In certain embodiments, planar support 31 (alone or in combination with other elements) may provide a sealed, desiccated chamber for electronics components on a first side. TRIMM support 33 may support one or more electronics components, such as TRIMMs 16. TRIMM support may be any suitable shape and/or size. Certain embodiments of frame 22 (and AESA structure 10) may not require TRIMM support 33.

In certain embodiments, planar support 31, TRIMM support 33, the ventilated panel, frame support 50, and/or thermal interfaces 30 or thermal pedestals 30a may be integrated with frame 22 (and/or baseplate 40). For example, in certain embodiments, frame 22 comprises a single integrated structure that includes planar support 31, frame support 50, the ventilated panel, and/or thermal interfaces 30. In other embodiments, frame 22 may be a single integrated structure comprising one, some, all, or none of the described elements or components. Accordingly, it is expressly noted that, although in the disclosed embodiments certain elements are represented as components of other elements, such components may be related in any suitable manner. Certain descriptions, characteristics, and features of frame 22 also apply to elements of frame 22, including planar support 31, TRIMM support 33, the ventilated panel, and frame supports.

In certain embodiments, the illustrated components are designed and assembled to provide air cooling to electronics components in AESA structure 10. In certain embodiments, air may flow into AESA structure 10 via air inlets 24, through internal plenums 46, air channels, and heat sink material 34 (receiving waste heat), and out of AESA structure 10 via openings 48 in baseplate 40. Baseplate 40 encloses components of AESA structure 10 and may at least partially define plenum 46.

Electronic interface 32 electrically couples with a TRIMM 16. In certain embodiments, frame 22 (e.g., planar support 31 and TRIMM support 33) may support TRIMMs 16. In certain embodiments, electronic interface 32 may include a DC and/or RF manifold, and may be used to distribute DC power and/or an RF network for TRIMM 16. In certain embodiments, each TRIMM 16 or a group of TRIMMs 16 may include separate electronic interfaces 32. Accordingly, in certain embodiments, if one or more TRIMMs 16 fail, remaining TRIMMs 16 may continue to function. In certain embodiments, one or more TRIMMs 16 may be removed, replaced, or taken out of service without disrupting the operation of other TRIMMs 16 in the array.

Electronic interface 32 may be coupled to frame 22 (e.g., planar support 31) so that additional structures are not needed for mounting electronics. In certain embodiments, the electronic interface is coupled with (e.g., bonded to, or integrated with) with frame 22 so as to reduce depth, weight, and size of AESA structure 10. In some embodiments, electronic interface 32 and thermal interface 30 may be partially or entirely located in a common planar space within AESA structure 10. In particular, the coplanar space shared by electronics interface 32 and thermal interface 30 within AESA structure 10 may comprise a substantially planar volume located adjacent to planar support 31. When TRIMMs 16 are coupled to electronics interface 32 and thermal interface 30, a portion of such TRIMMs 16 may also be located within the planar space shared by those elements. Integrating elements of AESA structure 10 into a shared planar space may further reduce the size and weight of AESA structure 10.

Thermal interfaces 30 dissipate waste heat generated by TRIMMs 16 or other electronics, and may comprise materials suitable for conducting heat, such as copper. Thermal interface 30 may have any suitable configuration and location. One or more thermal interfaces 30 may be coupled to one or more TRIMMs 16, and may be integrated with or coupled to frame 22 (e.g., planar support 31). In certain embodiments, thermal interface 30 may serve as a mounting bracket for a TRIMM 16. In some embodiments, TRIMMs 16 may include copper thermal planes with brackets (e.g., removable right-angle brackets) that couple to a thermal interface 30. Thermal interfaces 30 may include one or more thermal pedestals 30a. Thermal interface 30 and/or thermal pedestal 30a may be coupled to TRIMM 16 to create space between TRIMM 16 and frame 22 that provides room for electronic interface 32. In certain embodiments, thermal interface 30 may be coplanar with electronic interface 32, which may reduce array depth. In certain embodiments, a thermal interface 30 may be located at or near each end of TRIMM 16. A thermal pedestal 30a may be located at or near the middle of TRIMM 16. In certain embodiments, one or more thermal pedestals 30a may be located in any suitable location, and some embodiments may not include any thermal pedestals 30a. For example, certain embodiments utilizing high-power TRIMMs may include multiple thermal pedestals 30a.

Heat sink material 34 transfers waste heat from the thermal pedestals 30 to a substance in contact with the heat sink (such as air), may comprise any material suitable for performing this function. In certain embodiments, heat sink material 34 may comprise the same material as frame 22. In some embodiments, heat sink material 34 may be a finned heat sink comprising any suitable material, such as aluminum heat sink material or graphite heat sink material, or may be a non-finned heat sink comprising any suitable material, such as reticulated aluminum foam or graphite. Heat sink material 34 may be bonded or otherwise coupled to frame 22 (e.g., planar support 31). Heat sink material 34 may be coupled to frame 22 at points corresponding to one or more thermal interfaces 30 to facilitate dissipation of waste heat. In certain embodiments, heat sink material 34 may provide additional stiffness and/or strength for AESA structure 10.

In certain embodiments, heat sink material 34, frame 22, TRIMM 16, and/or thermal interface 30 may be in thermal communication. In certain embodiments, heat sink material 34 may be coupled to (for example, bonded to) frame 22 and/or thermal interface 30, and may be coupled to a thermal insulator 36, such as foam. Heat sink material 34 may in some embodiments be removable. In some embodiments, heat sink material 34, thermal interface 30, and/or frame 22 may be manufactured as a single unit using, for example, a hog-out manufacturing process.

In some embodiments, array electronics (e.g., TRIMMs 16) within AESA structure 10 may be isolated from air flow through AESA structure. Planar support 31 (and/or additional components, e.g., radome 20) may provide a sealed cavity within AESA structure 10 for TRIMMs 16 and/or other components. Accordingly, in certain embodiments TRIMMs 16 may be contained within a sealed desiccated volume adjacent to planar support 31 to control humidity levels and/or prevent unclean air and/or contaminants flowing though portions of AESA structure 10 (e.g., plenums) from affecting TRIMMs 16.

As illustrated in FIG. 4, components of AESA structure 10 may define a plenum (i.e., air-flow path or air duct) 46 for air flow through the array enclosure. In certain embodiments, plenum 46 may be a volume bounded by components of frame 22 and baseplate 40. For example, in certain embodiments, plenum 46 may be defined by baseplate 40, planar support 31, and frame supports (not shown). However, plenum 46 may be a volume located between any suitable elements, including, for example, heat sink materials, radio-frequency transmission media, and/or other elements not described. Plenum 46 may have any suitable size and shape. Plenums 46 may correspond to (for example, receive air from) air inlets 24 located on frame 22 and/or air channels located within AESA structure 10 (e.g., in frame supports). In certain embodiments, plenums 46 may remove waste heat and/or be used for other suitable functions, such as facilitating a radio-frequency transmission network. Ambient air may enter plenums 46 via air inlets 24, pass through heat sink material 34, plenums 46, and air channels (not shown), and flow through one or more openings out of AESA structure 10. In certain embodiments, insulator 36 may additionally channel air through heat sink material 34. One or more cooling fans 38 may assist with air flow through the enclosure. Cooling fans 38 may include a plurality of redundant low-power fans. In certain embodiments, air flow paths though AESA structure 10 may follow any suitable path, such as a serial feed path, serpentine feed path, or parallel feed path.

Plenums 46 may also include one or more waveguides 42 operable to distribute RF energy through the AESA enclosure. In certain embodiments, a waveguide 42 may utilize strip line manifolds or microstrips. In other embodiments, any suitable radio-frequency transmission medium may be utilized (e.g., coaxial cable). In some embodiments, waveguide 42, plenums 46, and heat sink material 34 may be partially or entirely located in a common planar space in AESA structure 10. In certain embodiments, plenums 46 provides a multi-functional space within AESA structure 10 that may be utilized for any suitable purpose, and may include additional elements not described.

FIG. 5A illustrates a frame and baseplate of an AESA structure 10, according to certain embodiments. Baseplate 40 may be coupled with frame 22 and/or other components of AESA structure 10 to enclose certain components of AESA structure 10 and/or facilitate air cooling of certain components. In certain embodiments, baseplate 40 may be integrated with frame 22 and may be removably coupled to frame 22 to provide access to components in frame 22. Baseplate 40 may include one or more openings 48 and fans 38 for expelling air from the AESA enclosure. Baseplate 40 may be composed of aluminum, plastic, other metals or composites, or any suitable material.

Figure 5B:
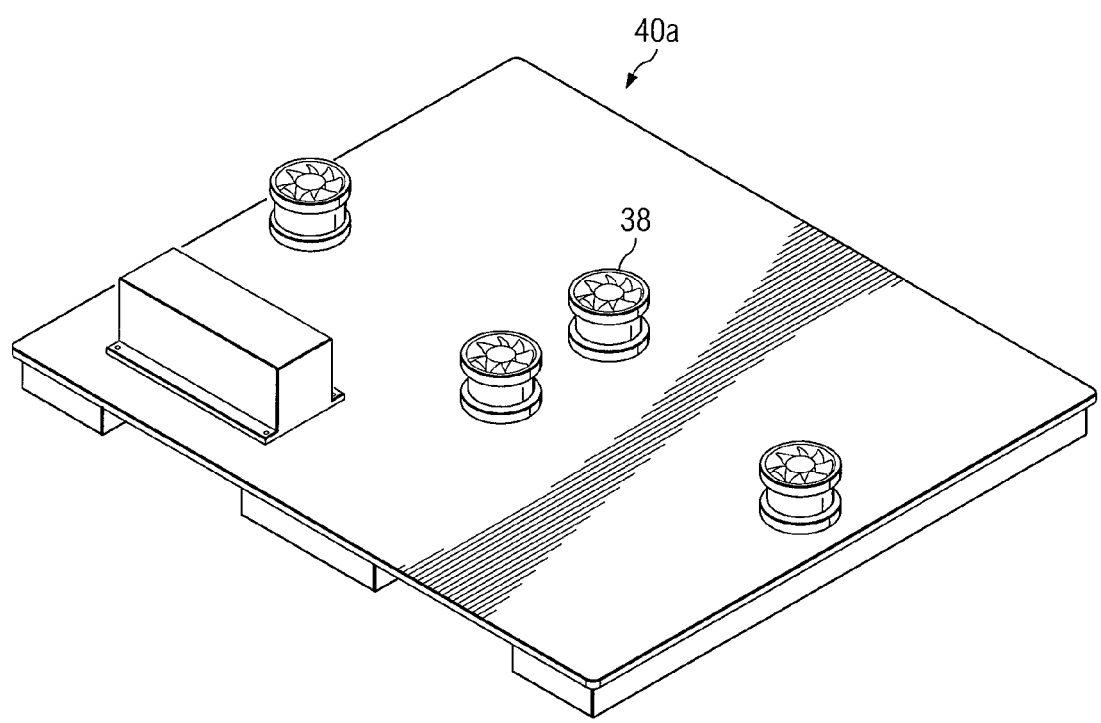

As illustrated in FIGS. 5A and 5B, in certain embodiments, baseplate 40 may comprise one or more sub-sections 40a. Sub-section 40a may at least partially form one or more plenums. A sub-section 40a may be removed without removing baseplate 40 to service, remove, or otherwise access components of AESA structure 10 without disrupting or interfering with operation of other components.

In certain embodiments, AESA structure 10 includes one or more apertures according to a modular design. In some embodiments, a sub-section 40a may correspond to (for example, cover) one or more apertures, where each aperture allows access to a power supply, cooling system, and/or electronics for one or more TRIMMs associated with each aperture. In certain embodiments, an aperture may comprise a modular sub-unit or "cell" of AESA structure 10 that includes independent and/or dedicated components, such as structural and cooling components (e.g., planar supports, TRIMM supports, frame supports, plenums, air channels/inlets, heat sink materials, thermal interfaces, thermal pedestals, openings, cooling fans, etc.), electronics (e.g., power supplies, electronics interfaces, TRIMMs, etc.), baseplate sub-sections, and/or other components. Apertures in a particular embodiment may be identical or similar, or may differ in any suitable manner.

Certain embodiments include one or more apertures arranged in any suitable manner. In certain embodiments, one or more apertures are arranged in a particular configuration to meet performance requirements. For example, embodiments may include apertures arranged (e.g., in a grid pattern) to meet performance requirements, size requirements, and/or provide various combinations of high-power and/or low-power TRIMMs. For example, certain embodiments may comprise one or more apertures for low-power TRIMMs surrounded by other apertures for high-power TRIMMs, or any suitable configuration. Apertures may allow for design flexibility and a multitude of configurations for AESA structure 10, while maintaining the same basic "cell" structure and providing various advantages, such as component redundancy, increased reliability, ease of maintenance and repair, and/or flexibility of design.

Figure 6A:
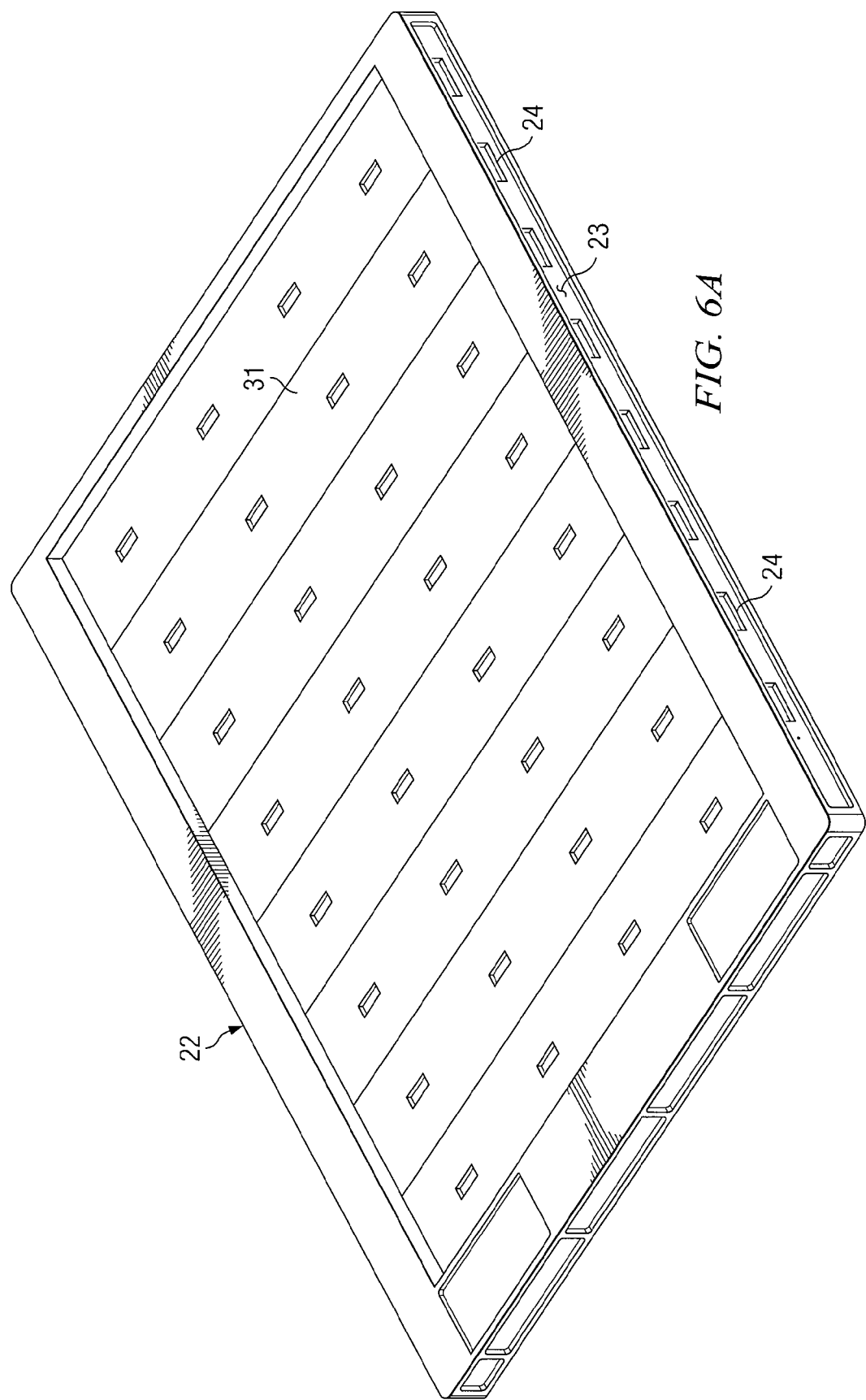
FIGS. 6A and 6B illustrate a frame for an AESA structure, according to certain embodiments.
Figure 6B:
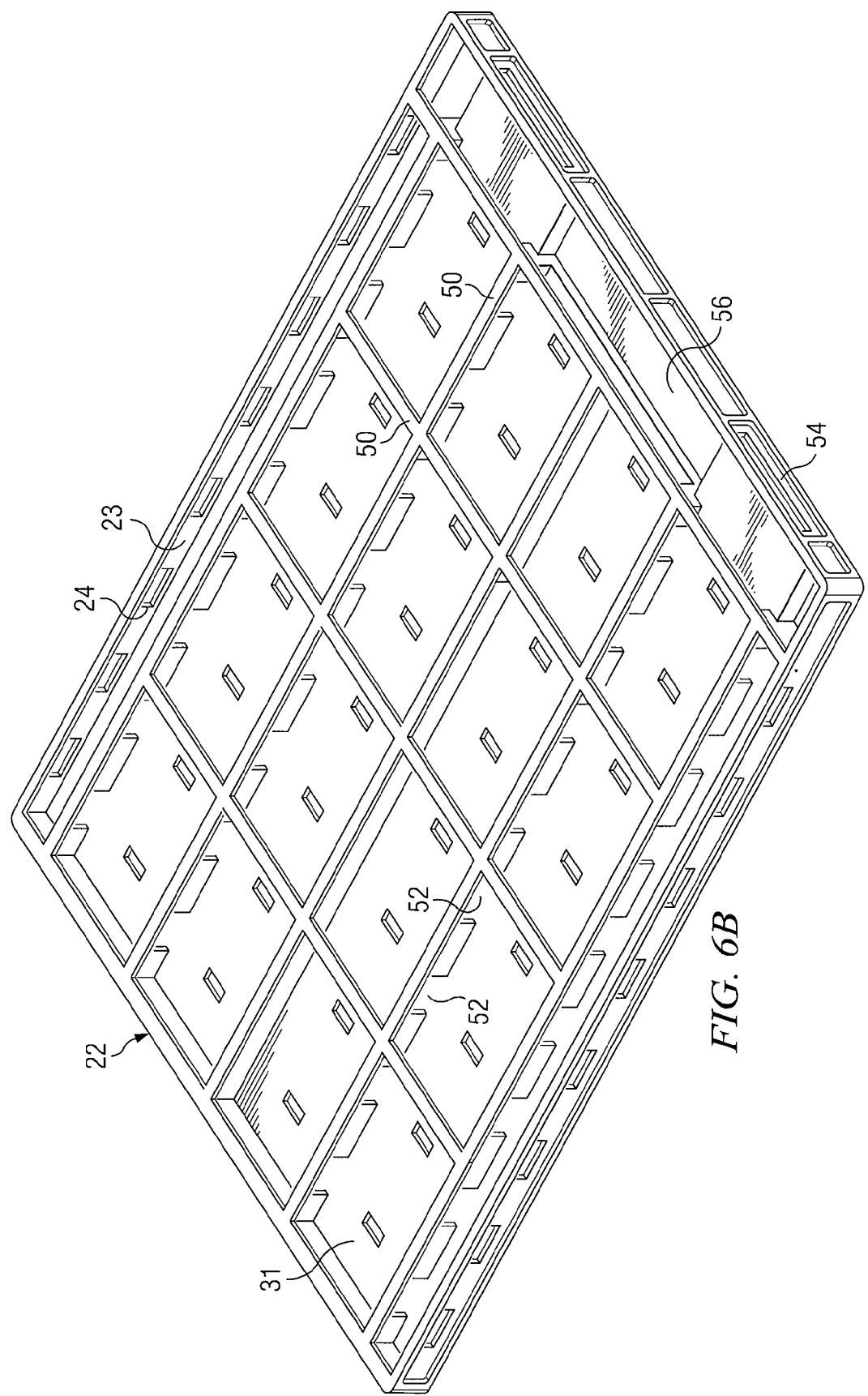

FIGS. 6A and 6B illustrate a frame 22 that includes planar support 31 and frame supports 50, according to certain embodiments. Frame 22 may have one or more frame supports 50 that provide additional strength, structural rigidity, and/or stiffness to frame 22. Frame supports 50 may provide physical partitioning for apertures (described above) and/or physical partitioning to form an air distribution network though AESA structure 10 (e.g., plenums, air channels 52). Frame supports 50 may have any suitable size, type, and configuration, and may be integrated with planar support 31. In certain embodiments, frame supports 50 comprise I-beams. Frame supports 50 may define air channels 52 (which may correspond to air inlets 24 on the outside of frame 22) for thermal management and/or air flow.

Frame supports 50 may comprise aluminum steel, carbon composite, titanium, or any other practicable material. Supports 50 may comprise the same material as frame 22 and may be integrated with frame 22. Frame supports 50 and additional components of frame 22 may be fabricated as a single article.

Figure 7:
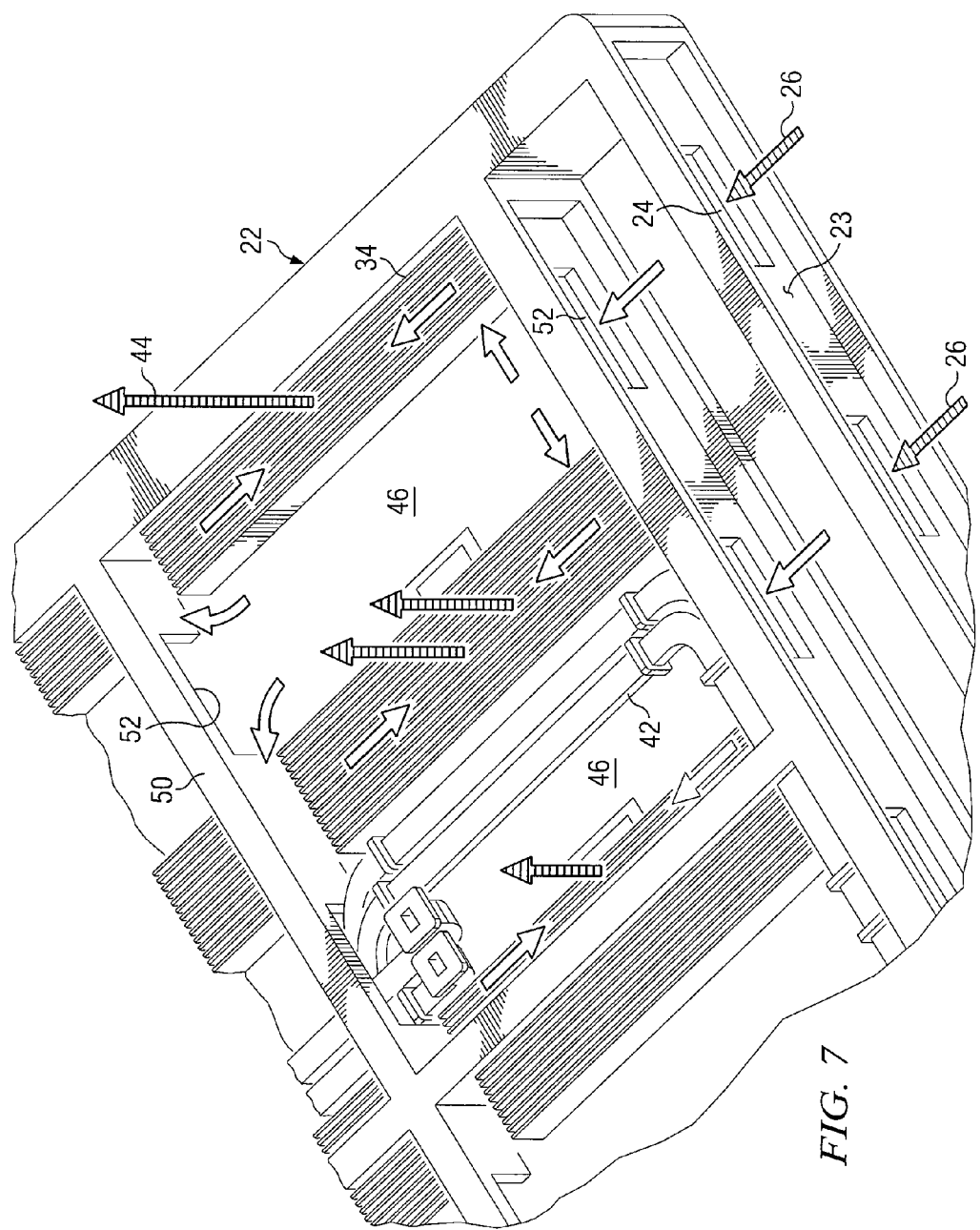
FIG. 7 illustrates air flow through an AESA structure, according to certain embodiments.

FIG. 7 illustrates air flow and removal of waste heat from an AESA structure 10 according to certain embodiments. During operation in certain embodiments, TRIMMs 16 produce waste heat which may accumulate. Heat from a TRIMM 16 is transferred to one or more thermal interfaces 30 coupled to the TRIMM 16, a mounting bracket, and/or a boss on the cavity floor. Waste heat is then transferred from thermal interface 30 to heat sink material 34.

In certain embodiments, ambient air 26 at a temperature below the temperature of the heat sink material 34 enters through inlet 24 and passes through air channels 52, plenums 46 and heat sink material 34. As the air flows through heat sink material 34, waste heat from the heat sink material 34 is transferred to the air flowing through it, thereby removing heat from heat sink 34. The heated air is then expelled through one or more openings 48 via cooling fans 38, which suck air through AESA structure 10. Although a particular air flow path is illustrated in FIG. 7, any suitable air flow path may be utilized. For example, certain embodiments may utilize a serial-feed air flow path, while other embodiments may utilize a serpentine or parallel feed air flow path for cooling. Additionally, any suitable fan configuration and/or any suitable air flow may be utilized.

As described in the disclosure, certain embodiments provide for an integrated structure for a phased array radar that includes thermal interfaces and electrical interfaces located in the same spatial plane, thereby reducing depth. Certain embodiments include multi-purpose structural elements that facilitate air-cooling of electronics components, thermal management, and structural stiffness and integrity. Additional technical advantages of certain embodiments include a partitioned design comprising modular sub-units that provide component redundancy and modular functionality for system reliability, adaptability, and maintainability. As a result, embodiments may provide a lightweight, simple, inexpensive, and compact solution for an array that combines thermal management, air management functionality, and structural integrity in a modular, adaptable design.

Numerous other changes, substitutions, variations, alterations, and modifications may be ascertained by those skilled in the art as intended that the present invention encompass all such changes, substitutions, variations, alterations, and modifications as falling within the spirit and scope of the claims. Moreover, the present invention is not intended to be limited in any way by any statement in the specification that is otherwise reflected in the claims.

What is claimed is:

1. A structure for electronic components, comprising:
   a baseplate having a substantially planar shape, the baseplate comprising a plurality of sub-sections, each sub-section removable from the baseplate, the baseplate defining one or more openings configured to allow air to flow through the openings;
   a frame coupled to the baseplate, the frame comprising:
      a planar support, the planar support having a substantially planar shape and substantially parallel to the baseplate, the planar support and baseplate at least partially defining one or more plenums, the planar support configured to support one or more transmit/receive integrated microwave modules,
      a plurality of frame supports, at least one of the frame supports defining one or more channels for air flow, each of the one or more channels corresponding to one of the one or more plenums;
      a ventilated panel having a surface defining a plurality of air inlets, the air inlets configured to allow air into one of the one or more plenums; and
      one or more thermal interfaces configured to dissipate heat, the one or more thermal interfaces including at least one thermal pedestal disposed between the planar support and at least one of the one or more transmit/receive modules, the at least one thermal pedestal configured to separate the planar support and one of the one or more transmit/receive modules;
   a heat sink material in thermal communication with at least one thermal interface, the heat sink material located within one of the one or more plenums and configured to dissipate heat;
   one or more electronic interfaces coupled to the planar support, each electronic interface configured to electronically couple to at least one of the one or more transmit/receive modules, at least one electronic interface having its own power supply, and at least a portion of each electronic interface coplanar with at least a portion of the one or more thermal interfaces;
   one or more cooling fans, each cooling fan associated with the one or more openings and configured to expel air from the plenums; and
   a radome coupled to the frame, the radome having a substantially planar shape and the radome substantially parallel to the baseplate.

2. A structure for electronic components, comprising:
   a baseplate having a substantially planar shape, the baseplate defining one or more openings configured to allow air to flow through the openings;
   a frame coupled to the baseplate, the frame comprising:
      a planar support, the planar support having a substantially planar shape and substantially parallel to the baseplate, the planar support and the baseplate at least partially defining one or more plenums, the planar support configured to support one or more transmit/receive integrated microwave modules;
      a plurality of frame supports, at least one of the frame supports defining one or more channels for air flow, each of the one or more channels corresponding to one of the one or more plenums;
      a ventilated panel having a surface defining a plurality of air inlets, the air inlets configured to allow air into one of the one or more plenums;
      one or more thermal interfaces configured to dissipate heat, the one or more thermal interfaces including at least one thermal pedestal disposed between the planar support and at least one of the one or more transmit/receive modules, the at least one thermal pedestal configured to separate the planar support and one of the one or more transmit/receive modules; and
   one or more electronic interfaces coupled to the planar support, each electronic interface configured to electronically couple to one of the one or more transmit/receive integrated microwave modules, and at least a portion of each electronic interface coplanar with at least a portion of the one or more thermal interfaces.

3. The structure of claim 2, further comprising:
   a heat sink material in thermal communication with at least one thermal interface, the heat sink material located within one of the one or more plenums and configured to dissipate heat.

4. The structure of claim 2, further comprising:
   a radome coupled to the frame, the radome having a substantially planar shape and the radome substantially parallel to the baseplate.

5. The structure of claim 2, further comprising:
   one or more cooling fans, each cooling fan associated with the one or more openings and configured to expel air from the plenums.

6. The structure of claim 2, further comprising:
   a radio-frequency transmission medium located within one of the one or more plenums and configured to distribute radio frequency energy.

7. The structure of claim 2, at least one of the one or more electronic interfaces having its own power supply.

8. The structure of claim 2, the baseplate comprising a plurality of sub-sections, each sub-section removable from the baseplate.

9. A structure for electronic components, comprising:
a baseplate having a substantially planar shape, the baseplate defining one or more openings configured to allow air to flow through the openings;
a frame coupled to the baseplate, the frame comprising:
a planar support, the planar support having a substantially planar shape and substantially parallel to the baseplate, the planar support and the baseplate at least partially defining one or more plenums, the planar support configured to support one or more transmit/receive integrated microwave modules;
a plurality of frame supports, at least one of the frame supports defining one or more channels for air flow, each of the one or more channels corresponding to one of the one or more plenums;
a ventilated panel having a surface defining a plurality of air inlets, the air inlets configured to allow air into one of the one or more plenums; and
one or more thermal interfaces configured to dissipate heat;
one or more electronic interfaces coupled to the planar support, each electronic interface configured to electronically couple to one of the one or more transmit/receive integrated microwave modules, and at least a portion of each electronic interface coplanar with at least a portion of the one or more thermal interfaces; and
a desiccant cartridge coupled to the frame, the desiccant cartridge configured to remove moisture from a volume located between the planar support and a radome coupled to the frame, the radome having a substantially planar shape and the radome substantially parallel to the planar support.

10. A structure for electronic components, comprising:
a baseplate having a substantially planar shape, the baseplate defining one or more openings configured to allow air to flow through the openings; and
a frame coupled to the baseplate, the frame comprising:
a planar support, the planar support having a substantially planar shape and substantially parallel to the baseplate, the planar support and the baseplate at least partially defining one or more plenums, the planar support configured to support one or more transmit/receive integrated microwave modules;
a plurality of frame supports, at least one of the frame supports defining one or more channels for air flow, each of the one or more channels corresponding to one of the one or more plenums;
a ventilated panel having a surface defining a plurality of air inlets, the air inlets configured to allow air into one of the one or more plenums; and
one or more thermal interfaces configured to dissipate heat; the one or more thermal interfaces including at least one thermal pedestal disposed between the planar support and at least one of the one or more transmit/receive modules, the at least one thermal pedestal configured to separate the planar support and one of the one or more transmit/receive modules.

11. The structure of claim 10, further comprising:
one or more electronic interfaces coupled to the planar support, each electronic interface configured to electronically couple to one or more transmit/receive integrated microwave modules, and at least a portion of each electronic interface coplanar with at least a portion of the one or more thermal interfaces.

12. The structure of claim 10, the planar support further comprising:
a heat sink material in thermal communication with at least one thermal interface, the heat sink material located within one of the one or more plenums and configured to dissipate heat; and
a radome coupled to the frame, the radome having a substantially planar shape and the radome substantially parallel to the baseplate.

13. The structure of claim 10, further comprising:
one or more cooling fans, each cooling fan associated with the one or more openings and configured to expel air from one of the plenums.

14. The structure of claim 10, the baseplate comprising a plurality of sub-sections, each sub-section removable from the baseplate.

15. A structure for electronic components, comprising:
a baseplate having a substantially planar shape, the baseplate defining one or more openings configured to allow air to flow through the openings, the baseplate comprising a plurality of sub-sections, each sub-section removable from the baseplate;
a frame coupled to the baseplate, the frame comprising:
a planar support, the planar support having a substantially planar shape and substantially parallel to the baseplate, the planar support and the baseplate at least partially defining one or more plenums, the planar support configured to support one or more transmit/receive integrated microwave modules;
a ventilated panel having a surface defining a plurality of air inlets, the air inlets configured to allow air into one of the plenums; and
one or more thermal interfaces configured to dissipate heat, the one or more thermal interfaces including at least one thermal pedestal disposed between the planar support and at least one of the one or more transmit/receive modules, the at least one thermal pedestal configured to separate the planar support and one of the one or more transmit/receive modules; and
a heat sink material in thermal communication with at least one thermal interface, the heat sink material located within one of the one or more plenums and configured to dissipate heat.

16. The structure of claim 15, further comprising:
one or more electronic interfaces coupled to the planar support, each electronic interface configured to electronically couple to one of the one or more transmit/receive integrated microwave modules, and at least a portion of each electronic interface coplanar with at least a portion of the one or more thermal interfaces.

17. The structure of claim 15, wherein the frame further comprises:
a plurality of frame supports, at least one of the frame supports defining one or more channels for air flow, each of the one or more channels corresponding to one of the one or more plenums.

18. The structure of claim 15, further comprising:
one or more cooling fans, each cooling fan associated with the one or more openings and configured to expel air from one of the plenums.

19. The structure of claim 15, further comprising:
a radio-frequency transmission medium located within one of the one or more plenums and configured to distribute radio frequency energy.

* * * * *